United States Patent
Zhou et al.

(10) Patent No.: US 10,770,671 B2
(45) Date of Patent: Sep. 8, 2020

(54) DISPLAY PANEL, DISPLAY DEVICE, AND MANUFACTURING METHOD OF THE DISPLAY PANEL

(71) Applicant: BOE TECHNOLOGY GROUP CO., LTD., Beijing (CN)

(72) Inventors: Qingchao Zhou, Beijing (CN); Shengji Yang, Beijing (CN); Qing Wang, Beijing (CN); Xiaochuan Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/389,196

(22) Filed: Apr. 19, 2019

(65) Prior Publication Data
US 2020/0035936 A1    Jan. 30, 2020

(30) Foreign Application Priority Data
Jul. 24, 2018   (CN) .......................... 2018 1 0818785

(51) Int. Cl.
| H01L 51/50 | (2006.01) |
| H01L 27/32 | (2006.01) |
| H01L 51/00 | (2006.01) |
| H01L 51/52 | (2006.01) |

(52) U.S. Cl.
CPC .......... H01L 51/502 (2013.01); H01L 27/322 (2013.01); H01L 51/0026 (2013.01); H01L 51/5237 (2013.01)

(58) Field of Classification Search
CPC ............... H01L 51/502; H01L 51/0026; H01L 51/5237; H01L 27/322
USPC .......................................................... 257/40
See application file for complete search history.

(56) References Cited

U.S. PATENT DOCUMENTS

| 2011/0248256 | A1* | 10/2011 | Cok ...................... H01L 27/322 257/40 |
| 2016/0028035 | A1* | 1/2016 | Yang ................... H01L 51/5056 257/40 |
| 2017/0338212 | A1* | 11/2017 | Kuo ...................... H01L 27/1225 |
| 2018/0233625 | A1* | 8/2018 | Jung ....................... H01L 33/04 |

* cited by examiner

*Primary Examiner* — Igwe U Anya
(74) *Attorney, Agent, or Firm* — The Webb Law Firm

(57) ABSTRACT

The present disclosure provides a display panel, a display device, and a manufacturing method of the display panel. The display panel includes a light emitting unit; a color filter layer located on a light emission side of the light emitting unit; and a bonding structure located between the light emitting unit and the color filter layer configured to bond the light emitting unit and the color filter layer, wherein, the bonding structure comprises a quantum dot material for converting ultraviolet light into visible light.

15 Claims, 2 Drawing Sheets

US 10,770,671 B2

DISPLAY PANEL, DISPLAY DEVICE, AND MANUFACTURING METHOD OF THE DISPLAY PANEL

CROSS-REFERENCE TO RELATED APPLICATIONS

This application claims priority to Chinese Patent Application No. 201810818785.1, filed on Jul. 24, 2018, the contents of which are hereby incorporated by reference in their entirety for all purposes.

TECHNICAL FIELD

The present disclosure relates to a display panel, a display device, and a manufacturing method of the display panel.

BACKGROUND

A silicon-based organic light-emitting diode (referred to as OLED) is a micro-display developed in recent years, and can be used for manufacturing OLED displays with high pixels per inch (referred to as PPI) and high refresh frequency due to the mature silicon-based semiconductor process.

A white OLED (referred to as WOLED) plus a color filter (referred to as CF) are used for realizing colorization in related art. In this process, the low temperature color filter (referred to as LTCF) technology can achieve the pixel processing accuracy of 1-2 microns.

SUMMARY

One aspect of the present disclosure provides a display panel, including: a light emitting unit; a color filter layer located on a light emission side of the light emitting unit; and a bonding structure located between the light emitting unit and the color filter layer configured to bond the light emitting unit and the color filter layer, wherein, the bonding structure includes a quantum dot material configured to convert ultraviolet light into visible light.

In some embodiments, a mass percentage concentration of the quantum dot material in the bonding structure is about 0.5% to 5%.

In some embodiments, the quantum dot material in the bonding structure is configured to absorb visible light with a first wavelength range and convert the visible light with the first wavelength range into visible light with a second wavelength range, a color distribution proportion of the visible light with the first wavelength range is a first proportion and a color distribution proportion of the visible light with the second wavelength range is a second proportion when a mass percentage concentration of the quantum dot material is a first concentration, the color distribution proportion of the visible light with the first wavelength range is a third proportion and the color distribution proportion of the visible light with the second wavelength range is a fourth proportion when the mass percentage concentration of the quantum dot material is a second concentration, wherein the first wavelength range does not coincide with the second wavelength range, the second concentration is greater than the first concentration, the third proportion is greater than the first proportion, and the fourth proportion is less than the second proportion.

In some embodiments, the bonding structure includes: a packaging layer located on one side of the light emitting unit adjacent to the color filter layer configured to package the light emitting unit; and a bonding layer located on one side of the packaging layer adjacent to the color filter layer, wherein, the quantum dot material is included in at least one of the packaging layer or the bonding layer.

In some embodiments, the bonding structure includes: a packaging layer located on one side of the light emitting unit adjacent to the color filter layer configured to package the light emitting unit; a bonding layer located on one side of the packaging layer adjacent to the color filter layer; and a quantum dot material layer including the quantum dot material and located between the packaging layer.

In some embodiments, the bonding structure includes: a packaging layer located on one side of the light emitting unit adjacent to the color filter layer configured to package the light emitting unit; a bonding layer located on one side of the packaging layer adjacent to the color filter layer; and a quantum dot material layer comprising the quantum dot material and located on one side of the packaging layer adjacent to the light emitting unit.

In some embodiments, the quantum dot material includes a green light quantum dot material.

In some embodiments, the quantum dot material includes a thermally quenchable quantum dot material.

In some embodiments, a thermal quenching temperature of the thermally quenchable quantum dot material is about 60° C. to 80° C.

In some embodiments, the thermally quenchable quantum dot material includes an organic-inorganic hybrid quantum dot material.

In some embodiments, the organic-inorganic hybrid quantum dot material includes at least one of $CH_3NH_3PbCl_3$, $CH_3NH_3PbBr_3$ or $CH_3NH_3PbI_3$.

In some embodiments, the light emitting unit is an electroluminescent device or a liquid crystal display.

Another aspect of the present disclosure provides a display device, including the aforementioned display panel.

Another aspect of the present disclosure provides a manufacturing method of a display panel, including:

providing a light emitting unit;

forming a bonding structure including a quantum dot material on a light emitting side of the light emitting unit, so as to convert ultraviolet light into visible light when the ultraviolet light is used to cured on the bonding structure; and forming a color filter layer on one side of the bonding structure away from the light emitting unit.

In some embodiments, while the color filter layer is formed, the method further includes:

performing thermal quenching on the quantum dot material in the bonding structure.

BRIEF DESCRIPTION OF THE DRAWINGS

The drawings forming a part of the specification describe the embodiments of the present disclosure, and are used for explaining the principles of the present disclosure together with the specification.

The present disclosure can be more clearly understood according to the following detailed descriptions with reference to the drawings.

It should be understood that the dimensions of various parts shown in the drawings are not drawn according to the actual scale relationship. In addition, the same or similar reference numerals indicate the same or similar components.

DETAILED DESCRIPTION

Figure 1:
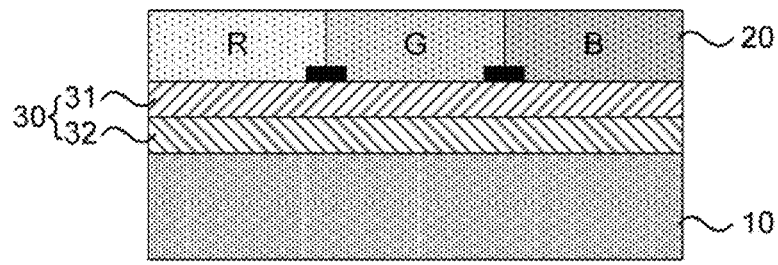
FIG. 1 is a structural schematic diagram according to one embodiment of a display panel of the present disclosure.

Various exemplary embodiments of the present disclosure will now be described in detail with reference to the drawings. The descriptions of the exemplary embodiments are merely illustrative, and are never used as any limitation to the present disclosure or the application or use thereof. The present disclosure can be implemented in many different forms and is not limited to the embodiments described herein. The embodiments are provided to make the present disclosure be thorough and complete and to fully express the scope of the present disclosure to those skilled in the art. It should be noted that, unless otherwise specified, the relative arrangement of components and steps and the constituents of materials set forth in these embodiments should be construed as illustrative only and are not used as limitations.

Similar words such as "including" or "comprising" and the like in the present disclosure are intended to mean that the elements in front of the word cover the elements listed behind the word, and the possibility of covering other elements is not excluded."Upper", "lower", "left", "right" and the like are only used for indicating relative position relationships, and after an absolute position of a described object changes, the relative position relationships may be correspondingly changed.

In the present disclosure, when it is described that a particular device is located between a first device and a second device, there may be an intermediate device between the particular device and the first device or the second device, or there may be no intermediate device. When it is described that the particular device is connected to other devices, the particular device can be directly connected to the other devices and have no intermediate device, and can also be not directly connected to the other devices and have the intermediate device.

All terms (including technical terms or scientific terms) used in the present disclosure have the same meanings as understood by those of ordinary skill in the art to which the present disclosure belongs, unless specifically defined otherwise. It should also be understood that, the terms defined in, for example, a general dictionary, should be interpreted as having meanings consistent with their meanings in the context of related art, and should not be interpreted by idealized or extremely formal meanings, unless explicitly defined herein.

Techniques, methods and devices known to those of ordinary skill in the related art may not be discussed in detail, but the techniques, methods and devices should be considered as a part of the specification, where appropriate.

In some related arts, colorization is achieved by using WOLED and CF. In the LTCF technology with higher pixel processing precision, a low temperature thermal curing process is often used. The inventors have found through researches that this process causes poor bonding property between a color filter layer and a packaging layer of an OLED, therefore a bonding layer often needs to be added between the color filter layer and the packaging layer. The bonding layer generally adopts a UV curing mode, and ultraviolet light in the UV curing process damages an organic material in the OLED.

In order to reduce or eliminate the adverse effects of the ultraviolet light on a light emitting unit, some embodiments of the present disclosure provide a display panel, including: a light emitting unit, a color filter layer and a bonding structure. The light emitting unit emits light when the display panel works. The light emitting unit can include an organic light emitting diode (OLED) or other electroluminescent (referred to as EL) devices. The color filter layer is arranged on a light emission side of the light emitting unit for performing color filtering on the light emitted from the light emitting unit so as to display various colors. The bonding structure is arranged between the light emitting unit and the color filter layer for bonding the light emitting unit and the color filter layer.

The bonding structure can include a quantum dot material for converting ultraviolet light into visible light. If ultraviolet light is involved in the process of manufacturing the display panel, the ultraviolet light that has adverse effects on the light emitting unit can be converted into the visible light that is harmless to the light emitting unit by the quantum dot material in the bonding structure, thereby reducing or eliminating the adverse effects of the ultraviolet light on the light emitting unit while completing the process involving the ultraviolet light.

FIG. 1 is a structural schematic diagram according to one embodiment of a display panel of the present disclosure;

Referring to FIG. 1, in some embodiments, the display panel includes a light emitting unit 10, a color filter layer 20 and a bonding structure 30. The color filter layer 20 and the bonding structure 30 are both located on the light emission side of the light emitting unit 10 which corresponds to an upper side of the light emitting unit 10 in FIG. 1. In FIG. 1, the bonding structure 30 includes a packaging layer 32 and a bonding layer 31. The packaging layer 32 is arranged on one side of the light emitting unit 10 adjacent to the color filter layer 20 for packaging the light emitting unit 10. The bonding layer 31 is arranged on one side of the packaging layer 32 adjacent to the color filter layer 20. The packaging layer 32 can be tightly combined with the light emitting unit 10 and can be tightly combined with the color filter layer 20 through the bonding layer 31.

The quantum dot material can be included in the packaging layer 32, that is to say, when the packaging layer 32 is formed, the quantum dot material is added to the material of the packaging layer 32 to distribute the quantum dot material in the packaging layer 32. The quantum dot material is optionally included in an organic layer of the packaging layer 32. When the ultraviolet light irradiates the packaging layer 32 from one side of the packaging layer 32 away from the light emitting unit 10 (i.e., from top to bottom in FIG. 1), the quantum dot material in the packaging layer 32 is capable of converting the ultraviolet light into visible light.

Similarly, the quantum dot material can also be included in the bonding layer 31. The quantum dot material is optionally included in the organic layer of the bonding layer 31. In some other embodiments, the quantum dot material can also be included both in the packaging layer 32 and the bonding layer 31, thus the mass concentration of the respective quantum dot materials of the packaging layer 32 and the bonding layer 31 can also be relatively reduced so as to reduce the influence of the quantum dot materials on the transmittance of the packaging layer 32 and the bonding layer 31.

Figure 2:
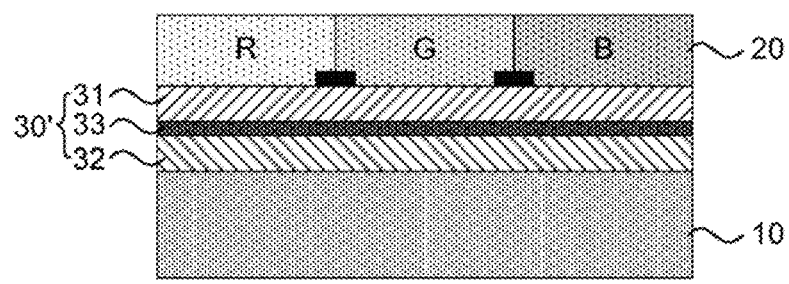
FIG. 2 is a structural schematic diagram according to another embodiment of a display panel of the present disclosure.

FIG. 2 is a structural schematic diagram according to another embodiment of a display panel of the present disclosure;

Referring to FIG. 2, in some embodiments, the display panel includes a light emitting unit 10, a color filter layer 20, and a bonding structure 30'. The bonding structure 30' includes a packaging layer 32, a bonding layer 31 and a quantum dot material layer 33. The packaging layer 32 is arranged on one side of the light emitting unit 10 adjacent to the color filter layer 20 for packaging the light emitting unit 10. The bonding layer 31 is arranged on one side of the packaging layer 32 adjacent to the color filter layer 20.

The quantum dot material layer 33 includes the quantum dot material that is capable of converting the ultraviolet light into the visible light. In FIG. 2, the quantum dot material layer 33 is arranged between the packaging layer 32 and the bonding layer 31. In some other embodiments, the quantum dot material layer 33 can also be arranged on one side of the packaging layer 32 adjacent to the light emitting unit 10, that is, on a lower side of the packaging layer 32 in FIG. 2, and is located between the packaging layer 32 and the light emitting unit 10. In addition, the quantum dot material layer 33 can be arranged at a plurality of locations mentioned above. In addition to disposing the quantum dot material layer, the quantum dot material can also be included in the bonding layer 31 and/or the packaging layer 32 according to needs.

In each of the above embodiments of the display panel, the quantum dot material can be set to a proper mass percentage concentration according to factors such as the irradiation intensity and amount of the ultraviolet light, in order to obtain better ultraviolet light conversion capability and thereby reducing or eliminating the adverse effects of the ultraviolet light on the light emitting unit. In addition, when the quantum dot material is arranged, the quantum dot material with lower mass percentage concentration can be arranged according to the influence of the quantum dot material on the light emitted from the light emitting unit, for example, the mass percentage concentration of the quantum dot material in the bonding structure 30 is set as about 0.5% to 5%, in order to convert the ultraviolet light and also reduce the adverse effects on the light emission of the light emitting unit. The range of the mass percentage concentration can be allowed to have an error of 5% to 10%.

When the quantum dot material is selected, a green light quantum dot material that is capable of converting the ultraviolet light into green light (with a main wavelength of 530-540 nm) can be selected, for example, a green light CdSe quantum dot material. This green light quantum dot material has higher conversion efficiency on the ultraviolet light, and thus can be set as lower mass percentage concentration to reduce the adverse effects thereof on the light emission of the light emitting unit. In some other embodiments, the quantum dot material can also include a red light quantum dot material for converting the ultraviolet light into red light (with a main wavelength of 615-620 nm) or a blue light quantum dot material for converting the ultraviolet light into blue light (with a main wavelength of 460-470 nm), etc.

In some other embodiments, the mass percentage concentration of the quantum dot material in the bonding structure 30 can also be configured to match a color distribution proportion of the light emitting unit 10. That is to say, when the mass percentage concentration of the quantum dot material is set, the conversion effect of quantum dots on the light emitted from the light emitting unit is also taken into consideration.

For example, for the quantum dot material which can absorb visible light with a first wavelength range and convert the visible light with the first wavelength range into visible light with a second wavelength range, when a mass percentage concentration of the quantum dot material is a first concentration, a color distribution proportion of the visible light with the first wavelength range is a first proportion and a color distribution proportion of the visible light with the second wavelength range is a second proportion. And when the mass percentage concentration of the quantum dot material is a second concentration, the color distribution proportion of the visible light with the first wavelength range is a third proportion and the color distribution proportion of the visible light with the second wavelength range is a fourth proportion. The first wavelength range does not coincide with the second wavelength range. The second concentration is greater than the first concentration, the third proportion is greater than the first proportion, and the fourth proportion is less than the second proportion.

The color distribution proportion means the brightness proportion of the color light corresponding to different wavelength ranges to the total brightness of the light emitted by the light emitting unit, for example, the brightness proportion of red light, green light, and blue light is 3:6:1, then the color distribution proportion of the red light, green light, and blue light are respectively 30%, 60% and 10%. For a quantum dot material which is capable of converting visible light absorbed with a first wavelength range into visible light with a second wavelength range (different from the first wavelength range), the mass percent concentration of the quantum dot material in the bonding structure is positively correlated with the amount of the visible light with the first wavelength range that is absorbed by the quantum dot material and the amount of the visible light with the second wavelength range that is converted into by the quantum dot material.

Thus, if the mass percent concentration of the quantum dot material is higher, the amount of visible light with the first wavelength range emitted by the light-emitting unit can be increased higher to compensate for the visible light converted by the quantum dot material, and/or the amount of visible light with the second wavelength range emitted by the light-emitting unit can be reduced higher to weaken the visible light emitted by the quantum dot material. For example, when the mass percent concentration of the quantum dot material is high enough to convert a part of blue light emitted from the light emitting unit into green light, the light emission proportion of the blue light in the color distribution proportion of the light emitting unit 10 can be adjusted to be higher to compensate the converted blue light, or the light emission proportion of the green light in the color distribution proportion of the light emitting unit 10 can be adjusted to be lower thereby reducing the adverse effects of the quantum dot material on the light emission of the light emitting unit.

In view of the adverse effects of the quantum dot material on the light emitting unit, another feasible solution is to deactivate the quantum dot material after converting the ultraviolet light. In some embodiments of the present disclosure, the quantum dot material includes quenchable quantum dot materials. For example, after the ultraviolet irradiation, these quantum dot materials can be quenched in a thermal quenching manner. Specifically, the quantum dot material can be quenched as much as possible by increasing the temperature of the quantum dot material, so that no adverse effect is caused on the light emission of the light emitting unit even if the quantum dot material with higher mass percent concentration is used.

Figure 3:
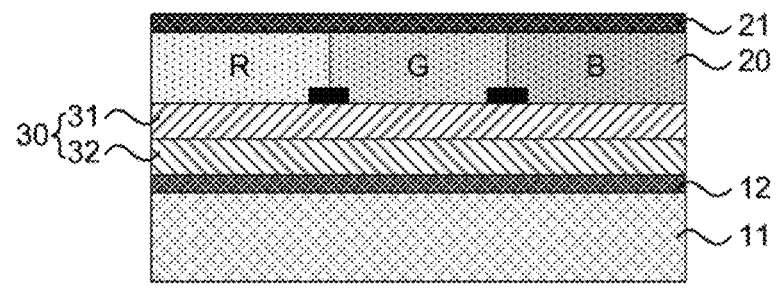
FIG. 3 is a structural schematic diagram according to still another embodiment of a display panel of the present disclosure.

FIG. 3 is a structural schematic diagram according to still another embodiment of a display panel of the present disclosure;

Taking WOLED plus CF as an example, a partial structure of the light emitting unit 10 is shown in FIG. 3, such as an EL layer 11 and an electrode layer 12 of the WOLED and the like. The packaging layer 32 is formed above the electrode layer 12. A CF packaging layer 21 is arranged on an upper surface of the color filter layer 20, and the bonding layer 31 is arranged between the color filter layer 20 and the packaging layer 32. A thermally quenchable quantum dot material is included in the bonding layer 31 or the packaging layer 32.

When the bonding layer 31 is cured by UV light, most of the ultraviolet light in the UV irradiation process is converted into the visible light by the quantum dot material, so that the organic material in the EL layer 11 is not damaged. In the thermal curing process of the color filter below, the quantum dot material can be quenched in a thermal quenching mode by using temperature conditions in the process. With respect to the low temperature color filter process capable of achieving high PPI, quantum dot quenching can be achieved based on the curing temperature thereof.

When the quantum dot material is selected, a suitable thermally quenchable quantum dot material can be selected according to a thermal curing temperature (for example, about 60° C. to 80° C.) of the color filter, in order to set the thermal curing temperature of the quantum dot material as about 60° C.~80° C. The range of the thermal curing temperature can be allowed to have an error of 5% to 10%. For example, an organic-inorganic hybrid quantum dot material is used, so that the quantum dot material becomes a substance having no light emitting properties by using the characteristic that an organic portion of the quantum dot material collapses at a specific temperature (about 60° C. to 80° C.), therefore the adverse effects on the light emission of the light emitting unit are eliminated. Optionally, the organic-inorganic hybrid quantum dot material includes at least one of $CH_3NH_3PbCl_3$, $CH_3NH_3PbBr_3$ or $CH_3NH_3PbI_3$, wherein $CH_3NH_3Cl$, $CH_3NH_3Br$ and $CH_3NH_3I$ are organic components, and $PbCl_2$, $PbBr_2$ and $PbI_2$ are inorganic components.

The embodiments of the above display panel can be used in a display device to implement a display function. Correspondingly, the embodiments of the present disclosure further provide a display device, including the embodiments of any one of the foregoing display panels.

Figure 4:
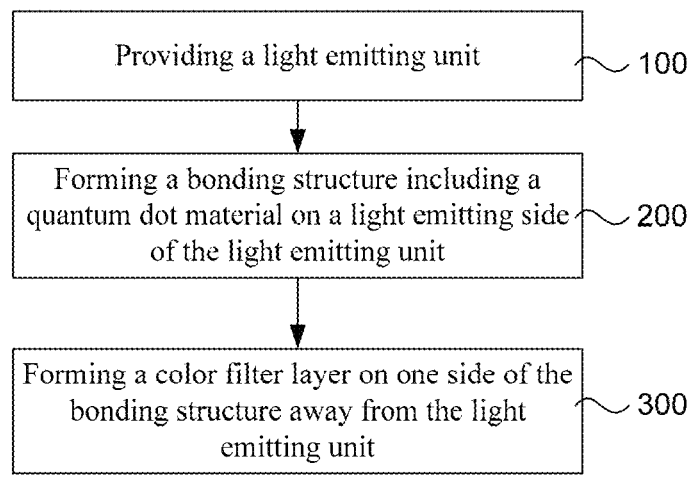
FIG. 4 is a schematic flow diagram of one embodiment of a manufacturing method of a display panel of the present disclosure.

FIG. 4 is a schematic flow diagram of one embodiment of a manufacturing method of a display panel of the present disclosure;

Referring to FIG. 4, in some embodiments, the manufacturing method of the display panel includes step 100 to step 300. In the step 100, a light emitting unit 10 is provided. In conjunction with the structure of the display panel shown in FIG. 3, when the light emitting unit 10 is provided, an electrode layer 12 can be formed on an upper side (i.e., a light emitting side) of an EL layer 11 after the EL layer 11 is formed.

In the step 200, a bonding structure 30 including a quantum dot material is formed on the light emitting side of the light emitting unit 10 so as to convert ultraviolet light into visible light when ultraviolet curing is performed on the bonding structure 30, thereby reducing or eliminating the adverse effects of the ultraviolet light on the light emitting unit while completing the processes involving the ultraviolet light. In combination with the structure of the display panel shown in FIG. 1 or FIG. 3, when the bonding structure 30 is formed, a packaging layer 32 can be formed on the upper side of the electrode layer 12, and a bonding layer 31 can be formed on the upper side of the packaging layer 32. A quantum dot material is included in at least one of the packaging layer 32 or the bonding layer 31. Then, the UV curing is performed on the bonding layer 31, and at least a part of the ultraviolet light is converted by the quantum dot material into the visible light during the UV curing.

If the structure of the display panel shown in FIG. 2 is adopted, a quantum dot material layer 33 is further formed when a bonding structure 30' is formed, and the quantum dot material layer 33 is formed between the packaging layer 32 and the bonding layer 31, and/or, on one side of the packaging layer 32 adjacent to the light emitting unit 10.

In the step 300, a color filter layer 20 is formed on one side of the bonding structure 30 away from the light emitting unit 10. Thus, when the low temperature color filter technology is applied, the bonding strength between the color filter layer 20 and the light emitting unit 10 can be ensured, and the adverse effects of the ultraviolet light on the light emitting unit 10 during the UV curing can also be avoided.

Figure 5:
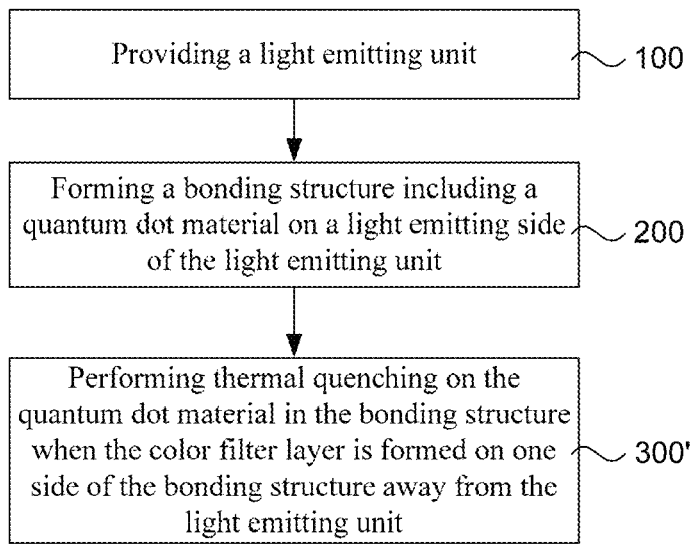
FIG. 5 is a schematic flow diagram of another embodiment of a manufacturing method of a display panel of the present disclosure.

FIG. 5 is a schematic flow diagram of another embodiments of a manufacturing method of a display panel of the present disclosure.

Compared with the embodiment of the manufacturing method shown in FIG. 4, in the present embodiment, when the bonding structure 30 is formed in the step 200, a thermally quenchable quantum dot material can be used. These thermally quenchable quantum dot materials are capable of converting at least a part of ultraviolet light during the UV curing into the visible light. Correspondingly, when the color filter layer 20 is formed in a step 300', thermal quenching is also performed on the quantum dot material in the bonding structure 30. By selecting the quantum dot material with an appropriate thermal quenching temperature, the thermal quenching of the quantum dot material can be completed in the process of forming the color filter by using the temperature conditions in the low temperature color filter technology.

The various embodiments in the present specification are described in a progressive manner, and the focuses of the embodiments are different, and the same or similar parts among the embodiments can be referred to each other. For the embodiment of the manufacturing method of the display panel, since the entirety and the steps involved have a corresponding relationship with the contents in the embodiment of the display panel, the description is relatively simple, and the relevant parts can be referred to the descriptions of the embodiment of the display panel.

So far, various embodiments of the present disclosure have been described in detail. In order to avoid obscuring the concepts of the present disclosure, some details known in the art are not described. Those skilled in the art can fully understand how to implement the technical solutions disclosed herein based on the above descriptions.

Although some specific embodiments of the present disclosure have been described in detail by way of examples, those skilled in the art should understand that the above embodiments may merely for the purpose of illustration, rather than limiting the scope of the present disclosure. Those skilled in the art should understand that the above embodiments can be modified or a part of technical features can be equivalently substituted without departing from the scope and spirit of the present disclosure. The scope of the present disclosure is defined by the appended claims.

What is claimed is:

1. A display panel, comprising:
   a light emitting unit;
   a color filter layer located on a light emission side of the light emitting unit; and
   a bonding structure located between the light emitting unit and the color filter layer configured to bond the light emitting unit and the color filter layer,
   wherein, the bonding structure comprises a quantum dot material configured to convert ultraviolet light into visible light.

2. The display panel according to claim 1, wherein a mass percentage concentration of the quantum dot material in the bonding structure is about 0.5% to 5%.

3. The display panel according to claim 1, wherein the quantum dot material in the bonding structure is configured to absorb visible light with a first wavelength range and convert the visible light with the first wavelength range into visible light with a second wavelength range, a color distribution proportion of the visible light with the first wavelength range is a first proportion and a color distribution proportion of the visible light with the second wavelength range is a second proportion when a mass percentage concentration of the quantum dot material is a first concentration, the color distribution proportion of the visible light with the first wavelength range is a third proportion and the color distribution proportion of the visible light with the second wavelength range is a fourth proportion when the mass percentage concentration of the quantum dot material is a second concentration, wherein the first wavelength range does not coincide with the second wavelength range, the second concentration is greater than the first concentration, the third proportion is greater than the first proportion, and the fourth proportion is less than the second proportion.

4. The display panel according to claim 1, wherein the bonding structure comprises:
   a packaging layer located on one side of the light emitting unit adjacent to the color filter layer configured to package the light emitting unit; and
   a bonding layer located on one side of the packaging layer adjacent to the color filter layer,
   wherein, the quantum dot material is in at least one of the packaging layer or the bonding layer.

5. The display panel according to claim 1, wherein the bonding structure comprises:
   a packaging layer located on one side of the light emitting unit adjacent to the color filter layer configured to package the light emitting unit;
   a bonding layer located on one side of the packaging layer adjacent to the color filter layer; and
   a quantum dot material layer comprising the quantum dot material and located between the packaging layer and the bonding layer.

6. The display panel according to claim 1, wherein the bonding structure comprises:
   a packaging layer located on one side of the light emitting unit adjacent to the color filter layer configured to package the light emitting unit;
   a bonding layer located on one side of the packaging layer adjacent to the color filter layer; and
   a quantum dot material layer comprising the quantum dot material and located on one side of the packaging layer adjacent to the light emitting unit.

7. The display panel according to claim 1, wherein the quantum dot material comprises a green light quantum dot material.

8. The display panel according to claim 1, wherein the quantum dot material comprises a thermally quenchable quantum dot material.

9. The display panel according to claim 8, wherein a thermal quenching temperature of the thermally quenchable quantum dot material is about 60° C. to 80° C.

10. The display panel according to claim 8, wherein the thermally quenchable quantum dot material comprises an organic-inorganic hybrid quantum dot material.

11. The display panel according to claim 10, wherein the organic-inorganic hybrid quantum dot material comprises at least one of $CH_3NH_3PbCl_3$, $CH_3NH_3PbBr_3$ or $CH_3NH_3PbI_3$.

12. The display panel according to claim 1, wherein the light emitting unit comprises an organic light emitting diode device.

13. A display device, comprising the display panel according to claims 1.

14. A manufacturing method of a display panel, comprising:
   providing a light emitting unit;
   forming a bonding structure comprising a quantum dot material on a light emitting side of the light emitting unit, so as to convert ultraviolet light into visible light when the ultraviolet light is used to cure on the bonding structure; and
   forming a color filter layer on one side of the bonding structure away from the light emitting unit.

15. The manufacturing method according to claim 14, wherein while the color filter layer is formed, the manufacturing method further comprises:
   performing thermal quenching on the quantum dot material in the bonding structure.

* * * * *